(12) United States Patent
Hino et al.

(10) Patent No.: US 9,093,361 B2
(45) Date of Patent: Jul. 28, 2015

(54) SEMICONDUCTOR DEVICE

(75) Inventors: Shiro Hino, Tokyo (JP); Naruhisa Miura, Tokyo (JP); Akihiko Furukawa, Tokyo (JP); Yukiyasu Nakao, Tokyo (JP); Tomokatsu Watanabe, Tokyo (JP); Masayoshi Tarutani, Tokyo (JP); Yuji Ebiike, Tokyo (JP); Masayuki Imaizumi, Tokyo (JP); Sunao Aya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/116,067

(22) PCT Filed: Mar. 7, 2012

(86) PCT No.: PCT/JP2012/055792
§ 371 (c)(1),
(2), (4) Date: Nov. 6, 2013

(87) PCT Pub. No.: WO2012/176503
PCT Pub. Date: Dec. 27, 2012

(65) Prior Publication Data
US 2014/0077232 A1    Mar. 20, 2014

(30) Foreign Application Priority Data
Jun. 23, 2011    (JP) .................................. 2011-139251

(51) Int. Cl.
*H01L 29/76*    (2006.01)
*H01L 29/16*    (2006.01)
(Continued)

(52) U.S. Cl.
CPC ............ *H01L 29/1608* (2013.01); *H01L 29/45* (2013.01); *H01L 29/66068* (2013.01);
(Continued)

(58) Field of Classification Search
CPC .............. H01L 29/45; H01L 29/66068; H01L 29/7802; H01L 29/7816; H01L 29/7845; H01L 29/1608; H01L 29/7811; H01L 29/0615; H01L 29/41766; H01L 29/0638; H01L 21/0485
USPC .............................................. 257/77, 76, 288
See application file for complete search history.

(56) References Cited

U.S. PATENT DOCUMENTS 6,906,393 B2    6/2005    Sayama et al.
7,183,204 B2    2/2007    Sayama et al.
(Continued)

FOREIGN PATENT DOCUMENTS

JP    3 252166    11/1991
JP    2002 184986    6/2002
(Continued)

OTHER PUBLICATIONS

International Search Report Issued May 22, 2012 in PCT/JP12/055792 Filed Mar. 7, 2012.

(Continued)

*Primary Examiner* — Nikolay Yushin
(74) *Attorney, Agent, or Firm* — Oblon, McClelland, Maier & Neustadt, L.L.P.

(57) ABSTRACT

A semiconductor device capable of suppressing time variation of a threshold voltage and a method of manufacturing the same. A semiconductor device according to the present invention comprises a drift layer formed on a semiconductor substrate, first well regions formed in a surface layer of the drift layer, being apart from one another, a gate insulating film formed, extending on the drift layer and each of the first well regions, a gate electrode selectively formed on the gate insulating film, a source contact hole penetrating through the gate insulating film and reaching the inside of each of the first well regions, and a residual compressive stress layer formed on at least a side surface of the source contact hole, in which a compressive stress remains.

12 Claims, 11 Drawing Sheets

(51) Int. Cl.
- *H01L 29/45* (2006.01)
- *H01L 29/66* (2006.01)
- *H01L 29/78* (2006.01)
- *H01L 21/04* (2006.01)
- *H01L 29/417* (2006.01)
- *H01L 29/06* (2006.01)

(52) U.S. Cl.
CPC ........ *H01L29/7802* (2013.01); *H01L 29/7811* (2013.01); *H01L 29/7816* (2013.01); *H01L 29/7845* (2013.01); *H01L 21/0485* (2013.01); *H01L 29/0615* (2013.01); *H01L 29/0638* (2013.01); *H01L 29/41766* (2013.01); *H01L 2924/0002* (2013.01)

(56) References Cited

U.S. PATENT DOCUMENTS

| | | | |
|---|---|---|---|
| 7,372,108 | B2 | 5/2008 | Linuma |
| 7,470,618 | B2 | 12/2008 | Sayama et al. |
| 7,671,409 | B2 * | 3/2010 | Kitabatake et al. ........... 257/341 |
| 7,741,220 | B2 | 6/2010 | Linuma |
| 7,872,316 | B2 | 1/2011 | Iwata |
| 7,960,281 | B2 | 6/2011 | Sayama et al. |
| 8,093,598 | B2 | 1/2012 | Ohtsuka et al. |
| 8,372,747 | B2 | 2/2013 | Sayama et al. |
| 2002/0109183 | A1 | 8/2002 | Ishimura et al. |
| 2011/0210392 | A1 * | 9/2011 | Nakata et al. ................. 257/341 |
| 2012/0037922 | A1 | 2/2012 | Kono et al. |
| 2012/0074508 | A1 | 3/2012 | Ohtsuka et al. |
| 2013/0130457 | A1 | 5/2013 | Sayama et al. |

FOREIGN PATENT DOCUMENTS

| | | | | |
|---|---|---|---|---|
| JP | 2004 172389 | | 6/2004 | |
| JP | 2007 81330 | | 3/2007 | |
| JP | 2008 288364 | | 11/2008 | |
| JP | 2010-238738 | * | 10/2010 | .............. H01L 29/78 |
| JP | 2010 282991 | | 12/2010 | |
| WO | 2007 108439 | | 9/2007 | |
| WO | 2008 038346 | | 4/2008 | |
| WO | WO2010/073759 | * | 1/2010 | .............. H01L 29/78 |
| WO | 2010 116575 | | 10/2010 | |

OTHER PUBLICATIONS

International Preliminary Report on Patentability and Written Opinion issued Jan. 9, 2014, in PCT/JP2012/055792, filed Mar. 7, 2012 with English translation.

U.S. Appl. No. 14/116,259, filed Nov. 7, 2013, Watanabe, et al.

* cited by examiner

F I G. 2
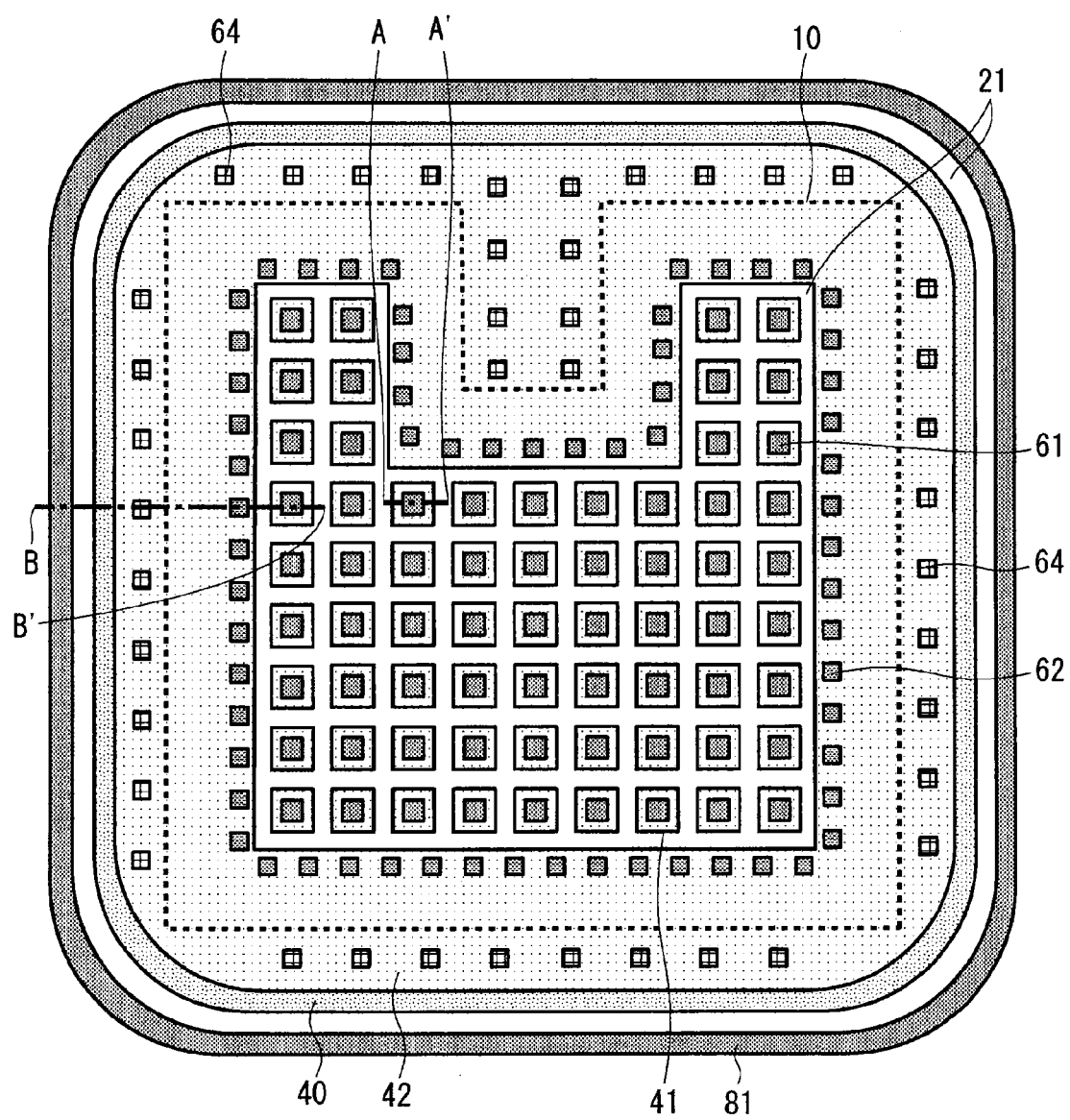

F I G. 7
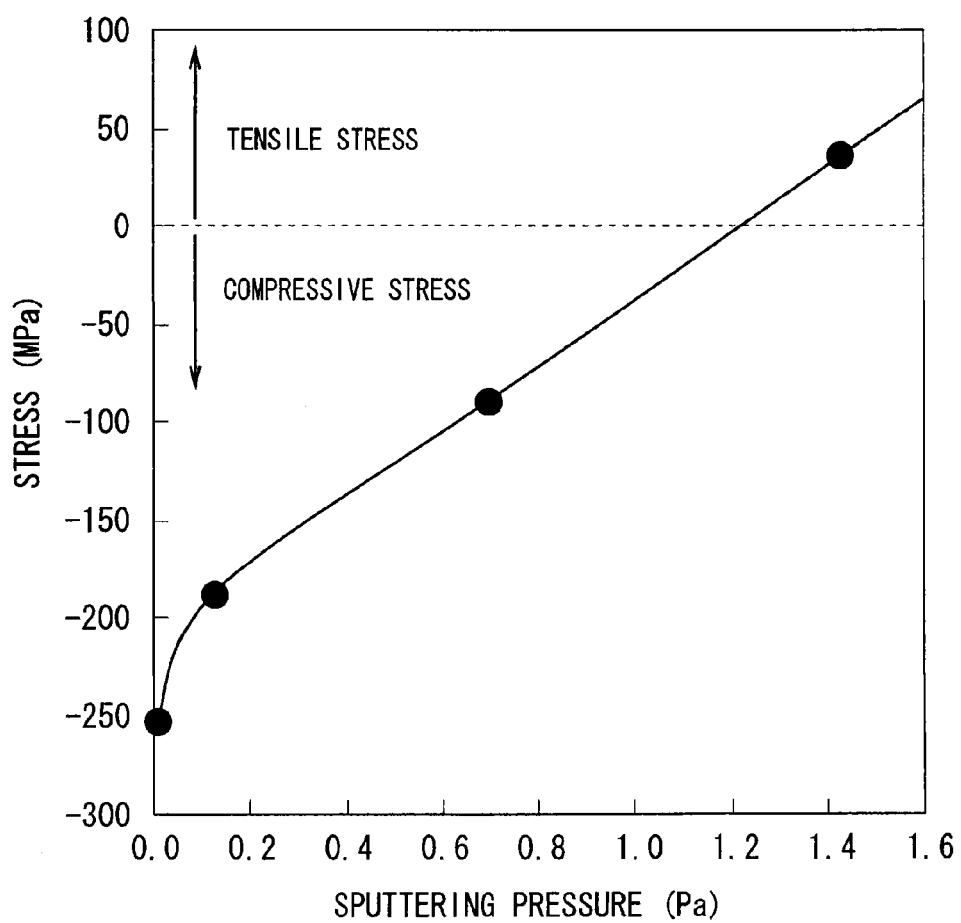

FIG. 8
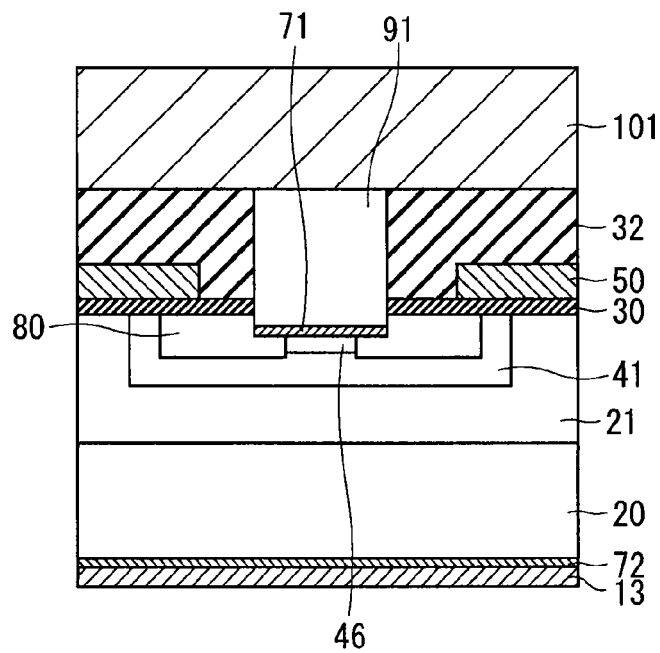
(a)
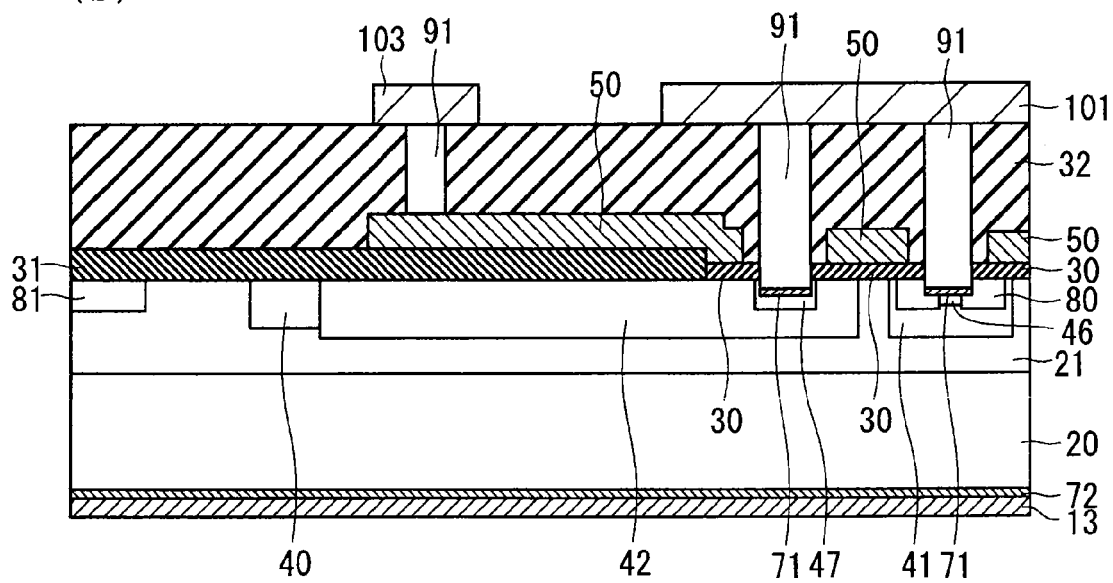
(b)

FIG. 9
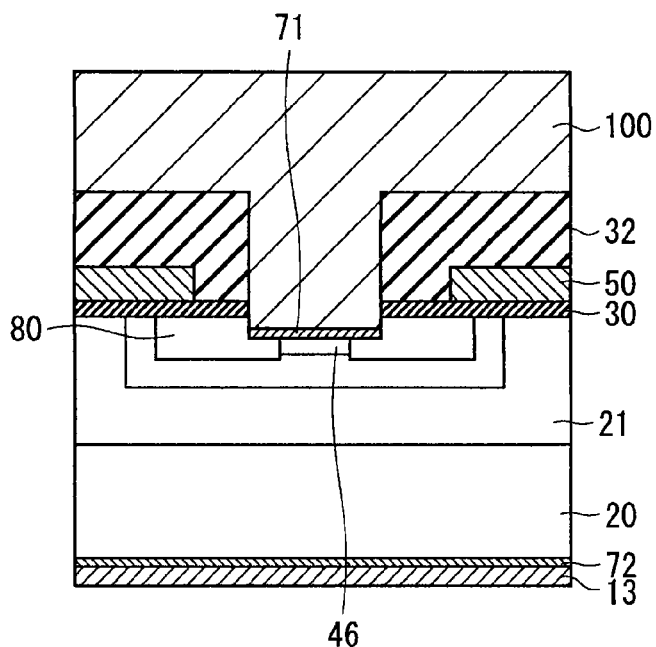
(a)
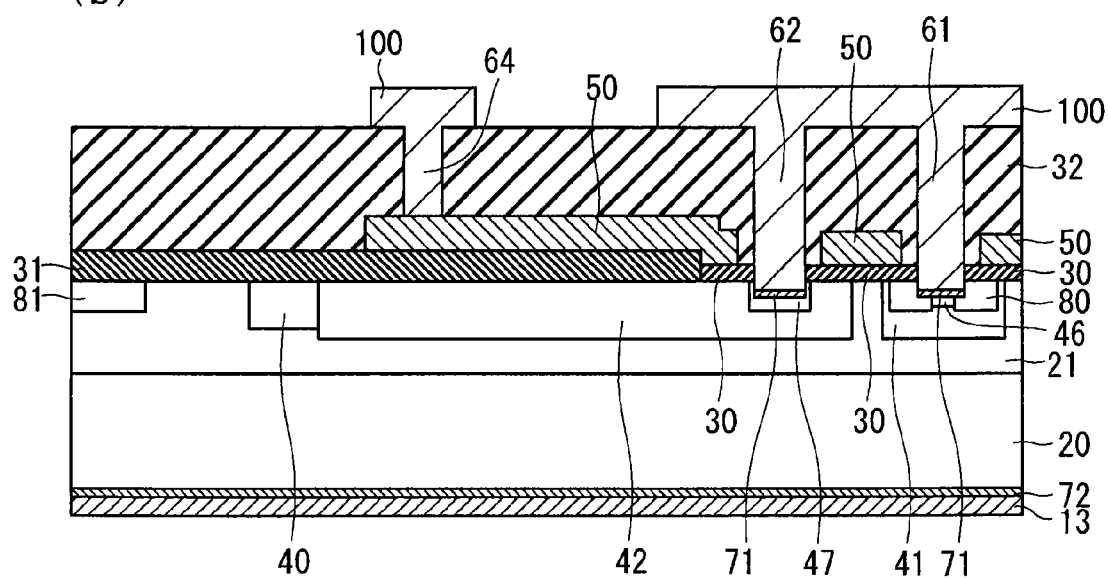
(b)

FIG. 10
(a)
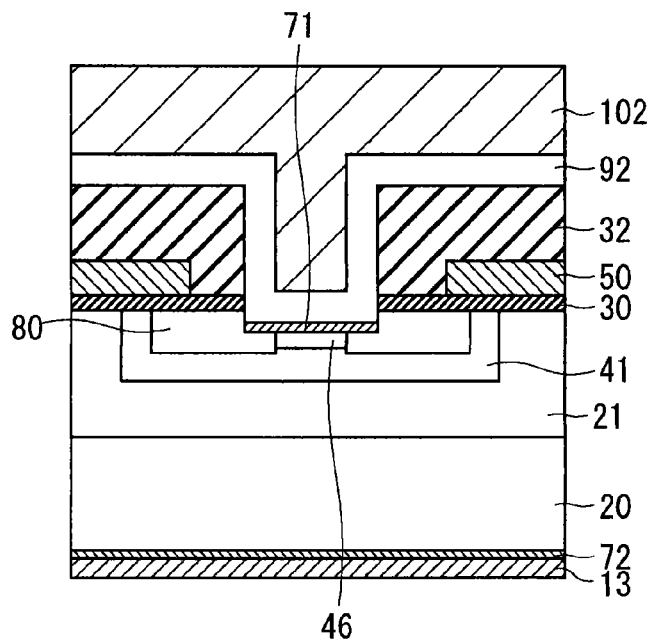
(b)
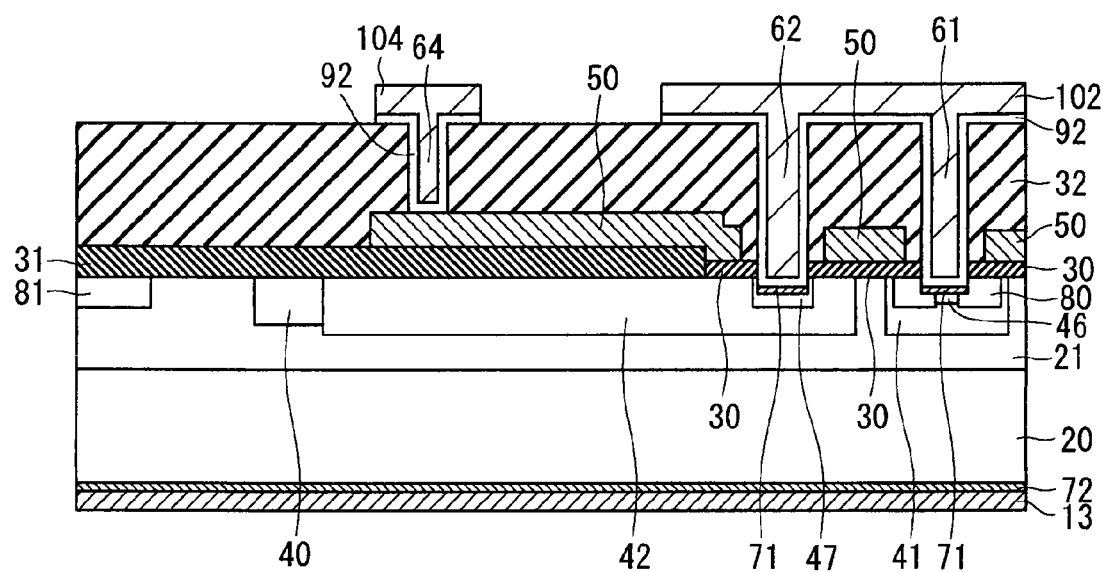

SEMICONDUCTOR DEVICE

TECHNICAL FIELD

The present invention relates to a semiconductor device and a method of manufacturing the same, and more particularly to a power semiconductor device.

BACKGROUND ART

Semiconductor devices having a so-called MOS (Metal-Oxide-Semiconductor) structure which has a multilayer structure consisting of a gate electrode, a gate insulating film, and a semiconductor layer have been conventionally used widely as power semiconductor devices.

As disclosed in, for example, Patent Document 1, various improvements have been made, such as reduction in the pinch resistance of a base region below an emitter region by forming a barrier metal layer containing nitrogen between an emitter electrode and an interlayer insulating film, and the like.

PRIOR-ART DOCUMENTS

Patent Documents

[Patent Document 1] Japanese Patent Application Laid Open Gazette No. 2002-184986

DISCLOSURE OF INVENTION

Problems to be Solved by the Invention

The inventor of the present application, however, found that in semiconductor devices such as discussed above, especially silicon carbide semiconductor devices, a threshold voltage disadvantageously changes with time when a voltage, particularly a negative bias, is applied to the gate electrode. This will be discussed in detail in description on an operation of the present invention.

The present invention is intended to solve the above problem, and it is an object of the present invention to provide a semiconductor device capable of suppressing time variation of a threshold voltage and a method of manufacturing the same.

Means for Solving the Problems

According to an aspect of the present invention, a semiconductor device includes a silicon carbide semiconductor substrate of a first conductivity type, a drift layer of the first conductivity type formed on the silicon carbide semiconductor substrate, first well regions each of a second conductivity type formed in a surface layer of the drift layer, being apart from one another, to form a plurality of unit cells, a gate insulating film formed extending on at least the drift layer and each of the first well regions, a gate electrode selectively formed on the gate insulating film, a source contact hole penetrating through the gate insulating film and reaching the inside of each of the first well regions, and a residual compressive stress layer formed on at least a side surface of the source contact hole, in which a compressive stress remains.

According to another aspect of the present invention, a semiconductor device includes a silicon carbide semiconductor substrate of a first conductivity type, a silicon carbide drift layer of the first conductivity type formed on the silicon carbide semiconductor substrate, first well regions each of a second conductivity type formed in a surface layer of a silicon carbide drift layer, being apart from one another, to form a plurality of unit cells, a gate insulating film formed, extending on at least the silicon carbide drift layer and each of the first well regions, a gate electrode selectively formed on the gate insulating film, a source contact hole penetrating through the gate insulating film and reaching the inside of the each of the first well regions and a residual compressive stress layer formed on at least a side surface of the source contact hole, in which a compressive stress remains; in the semiconductor device, the residual compressive stress layer is formed on a bottom surface of the source contact hole; the semiconductor device further includes an interlayer insulating film which is so formed as to cover the gate insulating film and the gate electrode; and in the semiconductor device, the residual compressive stress layer is also formed on an upper surface of the interlayer insulating film and the residual compressive stress layer is formed of a laminated layer film consisting of one layer containing Ti or more.

Effects of the Invention

Since the semiconductor device according to an aspect of the present invention includes the silicon carbide semiconductor substrate of the first conductivity type, the drift layer of the first conductivity type formed on the silicon carbide semiconductor substrate, the first well regions each of the second conductivity type formed in the surface layer of the drift layer, being apart from one another, to form a plurality of unit cells, the gate insulating film formed extending on at least the drift layer and each of the first well regions, the gate electrode selectively formed on the gate insulating film, the source contact hole penetrating through the gate insulating film and reaching the inside of each of the first well regions, and the residual compressive stress layer formed on at least the side surface of the source contact hole, in which a compressive stress remains, it is possible to suppress time variation in the threshold voltage of the gate electrode.

Since the semiconductor device according to another aspect of the present invention includes the silicon carbide semiconductor substrate of the first conductivity type, the silicon carbide drift layer of the first conductivity type formed on the silicon carbide semiconductor substrate, first well regions each of the second conductivity type formed in the surface layer of the silicon carbide drift layer, being apart from one another, to form a plurality of unit cells, the gate insulating film formed, extending on at least the silicon carbide drift layer and each of the first well regions, the gate electrode selectively formed on the gate insulating film, the source contact hole penetrating through the gate insulating film and reaching the inside of the each of the first well regions and the residual compressive stress layer formed on at least the side surface of the source contact hole, in which a compressive stress remains; in the semiconductor device, the residual compressive stress layer is formed on a bottom surface of the source contact hole; the semiconductor device further includes an interlayer insulating film which is so formed as to cover the gate insulating film and the gate electrode; and in the semiconductor device, the residual compressive stress layer is also formed on an upper surface of the interlayer insulating film and the residual compressive stress layer is formed of a laminated layer film consisting of one layer containing Ti or more, it is possible to suppress time variation in the threshold voltage of the gate electrode.

Further, since the method of manufacturing a semiconductor device of the present invention includes the step of forming the source contact hole by etching so that the source contact hole should reach the depth deeper than 5 nm from the surface layer of the drift layer inside the source region, the residual compressive stress layer is disposed in a range of lower and upper layers of a contact surface between the gate insulating film and a semiconductor surface, and by a residual stress therein, it is possible to draw the gate insulating film and the semiconductor surface apart from each other in a direction perpendicular to a main surface.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a plan view schematically showing the semiconductor device in accordance with the first preferred embodiment of the present invention;

FIG. 7 is a graph showing a relation between a sputtering pressure and a stress of an obtained Ti film;

FIG. 8 is a modified view schematically showing a cross section of part of a semiconductor device in accordance with a second preferred embodiment of the present invention;

FIG. 9 is a modified view schematically showing a cross section of part of a semiconductor device in accordance with a third preferred embodiment of the present invention;

FIG. 10 is a modified view schematically showing a cross section of part of a power semiconductor device in accordance with a fourth preferred embodiment of the present invention;

EMBODIMENTS FOR CARRYING OUT THE INVENTION

A. The First Preferred Embodiment

A-1. Structure

Figure 1:
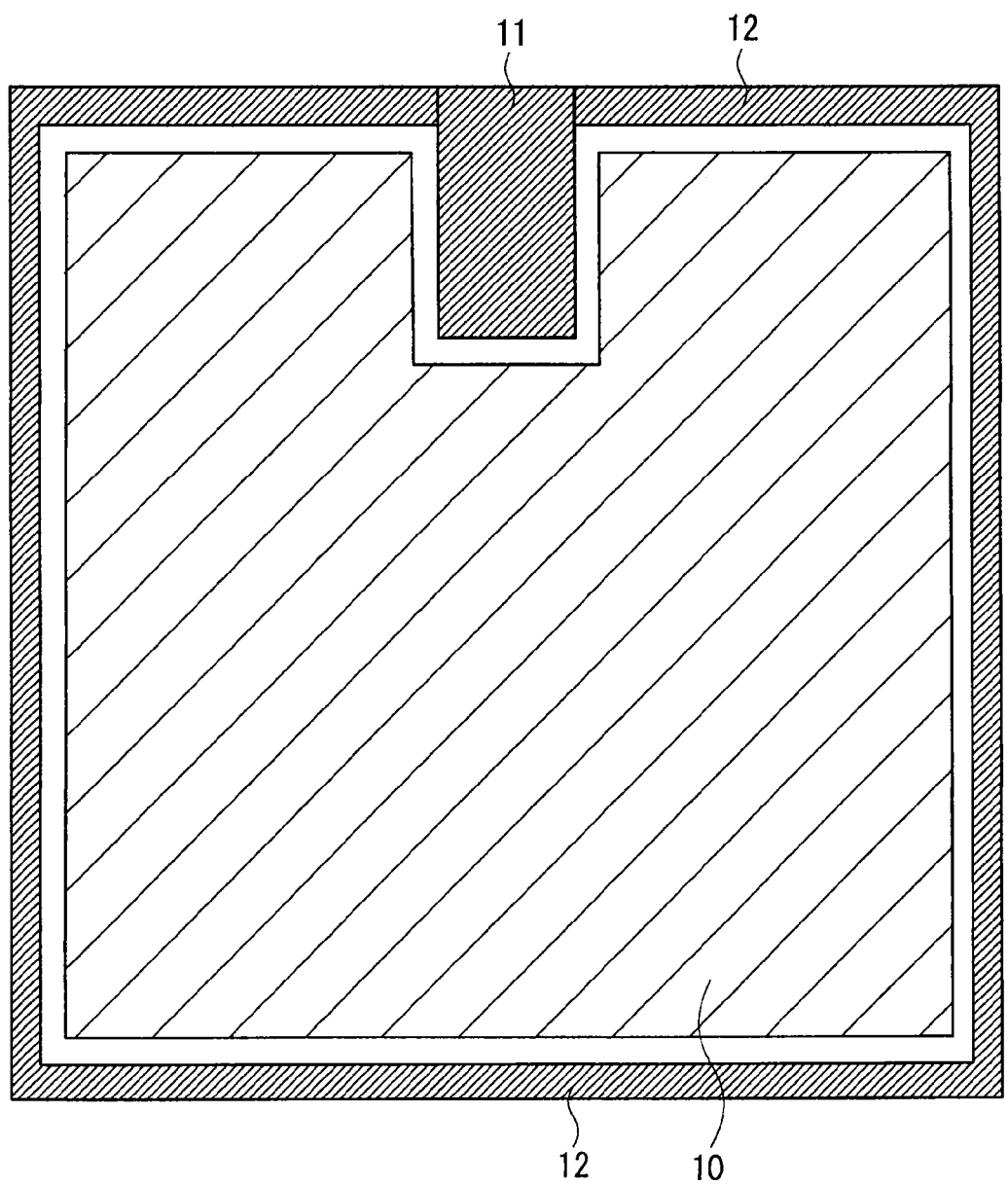
FIG. 1 is a plan view schematically showing a semiconductor device in accordance with a first preferred embodiment of the present invention.

FIG. 1 is a schematic plan view of a semiconductor device as viewed from above in accordance with the present invention. In this preferred embodiment, especially as a power semiconductor device, a MOSFET (Metal-Oxide-Semiconductor Field-Effect Transistor) using a substrate of silicon carbide is taken as an example.

In FIG. 1, a source pad 10 is provided at a center portion of an upper surface of a power semiconductor device. A gate pad 11 is provided on one side of the source pad 10 as viewed from above. Further, a gate wiring line 12 is so provided as to extend from the gate pad 11 and surround the source pad 10.

The source pad 10 is electrically connected to a source electrode of each of a plurality of unit cells (MOSFETs) provided in a cell region below the source pad 10.

The gate pad 11 and the gate wiring line 12 are electrically connected to a gate electrode of each unit cell. Then, a gate voltage supplied from an external control circuit is applied to the gate electrode of the unit cell.

FIG. 2 is a schematic plan view of a layer below another layer in which the source pad 10 (indicated by a broken line), the gate pad 11 (not shown), and the like of the power semiconductor device of FIG. 1 are provided, as perspectively viewed from above.

In FIG. 2, around the layer below the source pad 10 of FIG. 1, formed are well contact holes 62 penetrating through a not-shown interlayer insulating film. Further below the well contact holes 62, formed is a second well region 42 formed of p-type silicon carbide.

In an inside region (i.e., the layer below the source pad 10) surrounded by the well contact holes 62 and the second well region 42 in a plan view, provided is a cell region in which a plurality of unit cells discussed above are formed, being apart from one another. In the cell region, a plurality of source contact holes 61 are formed in the not-shown interlayer insulating film, and a first well region 41 formed of p-type silicon carbide is provided below each of the source contact holes 61.

A not-shown gate electrode is formed in a partial portion above the second well region 42, and gate contact holes 64 each of which is a hole electrically connecting the gate pad 11 (see FIG. 1) and the gate wiring line 12 (see FIG. 1) to the gate electrode are formed, penetrating the interlayer insulating film.

Figure 3:
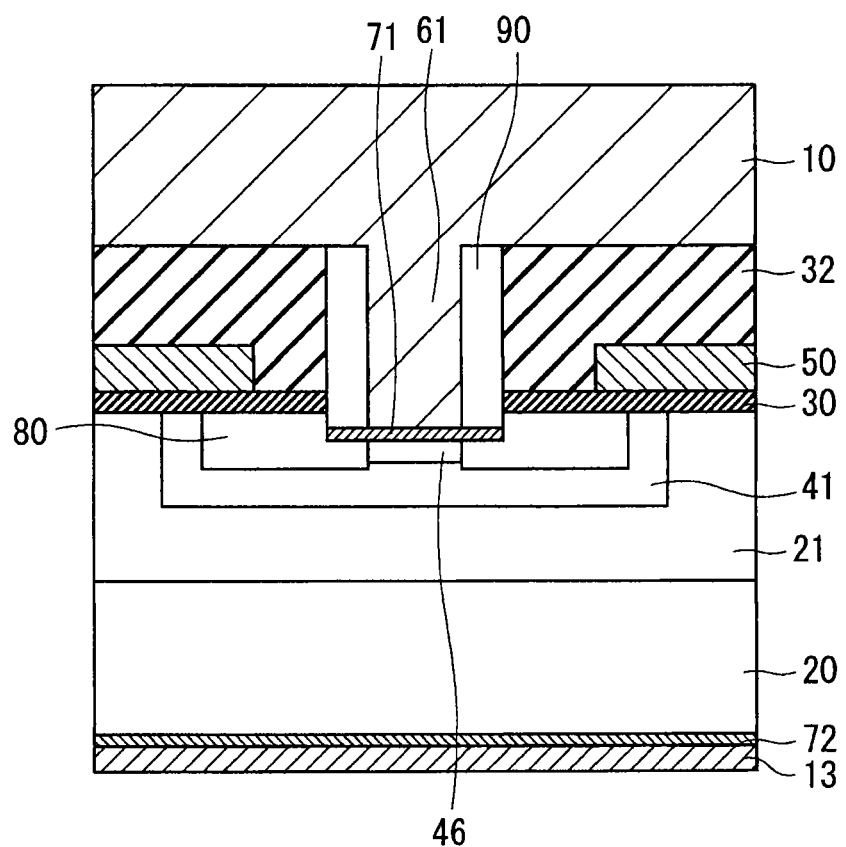
FIG. 3 is a sectional view schematically showing a cross section of part of the semiconductor device in accordance with the first preferred embodiment of the present invention.
Figure 4:
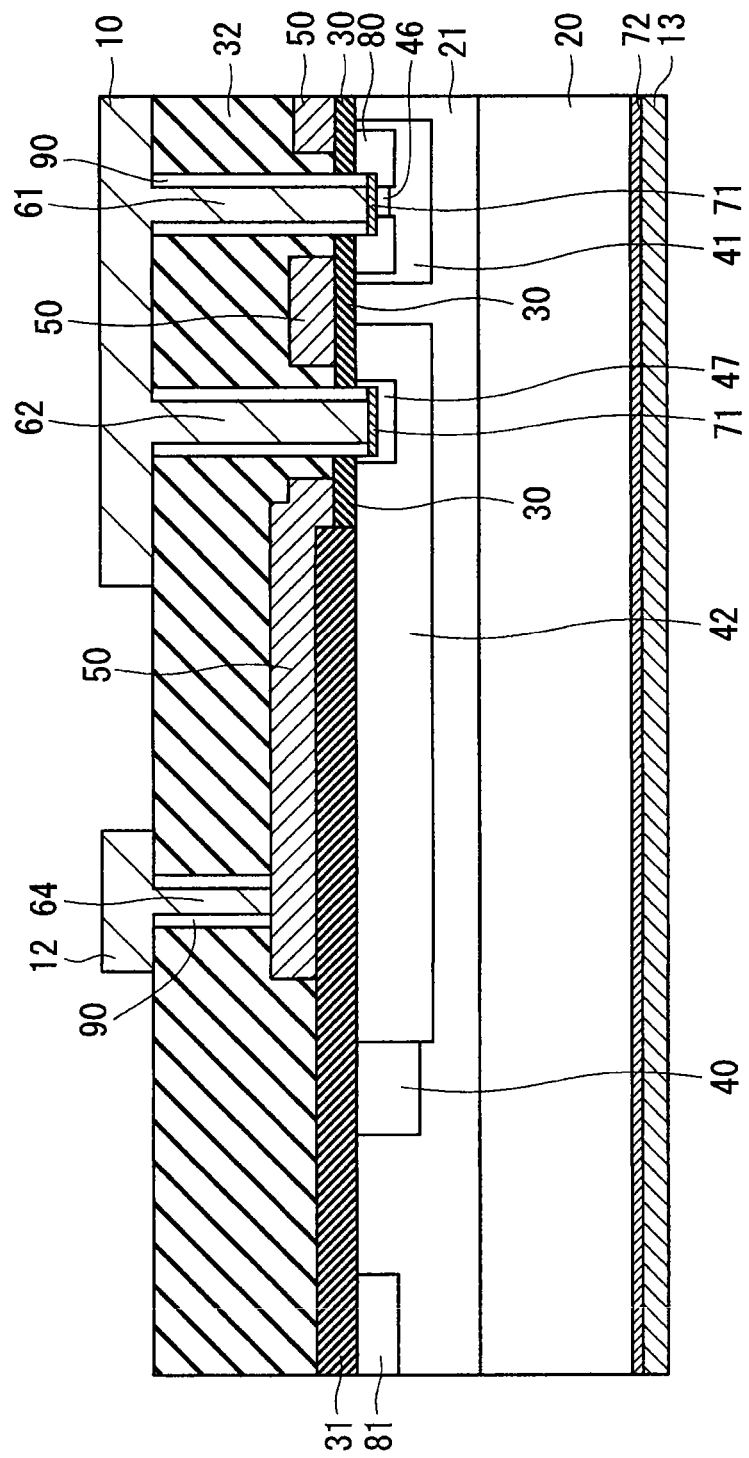
FIG. 4 is a sectional view schematically showing a cross section of part of the semiconductor device in accordance with the first preferred embodiment of the present invention.

FIG. 3 is a view schematically showing a cross section of a portion A-A' in the schematic plan view of FIG. 2, and FIG. 4 is a view schematically showing a cross section of a portion B-B' in the schematic plan view of FIG. 2.

In FIG. 3, a drift layer 21 formed of n-type silicon carbide is formed on a semiconductor substrate 20 formed of n-type low-resistance silicon carbide. The n type is a first conductivity type.

The first well region 41 formed of p-type silicon carbide is formed in a surface layer of the drift layer 21. The p type is a second conductivity type. In the cell region, a plurality of first well regions 41 are arranged, being apart from one another (see FIG. 2).

A source region 80 is partially formed in a surface layer of the first well region 41, and a first well contact region 46 is so formed as to be surrounded by the source region 80 in a plan view.

On the drift layer 21 including the first well region 41 and the source region 80, formed is a gate insulating film 30. The gate insulating film 30 is formed in a portion other than another portion on the first well contact region 46 and a surrounding portion thereof.

Further, a gate electrode 50 is formed in a region on the gate insulating film 30, above the drift layer 21 including part of the source region 80 and the first well region 41. The gate insulating film 30 is formed of, for example, silicon dioxide.

An interlayer insulating film 32 is so formed as to cover the gate insulating film 30 and the gate electrode 50. Then, the source pad 10 is formed on the first well contact region 46 and the surrounding portion thereof (the region extending over part of the source region 80) so as to form the source contact hole 61 penetrating through the interlayer insulating film 32. The source contact hole 61 is so formed as to dig into the source region 80 and the first well contact region 46 and reach the inside thereof, and an ohmic electrode 71 is formed on a bottom surface of the source contact hole 61.

Further, a residual compressive stress layer 90 is formed on a side surface of the source contact hole 61, i.e., a side surface of the source pad 10 or a side surface of the interlayer insulating film 32. The residual compressive stress layer 90 is a layer in which a compressive stress remains, and an effect caused by the stress will be discussed in detail in the description on an operation.

On the other hand, on a back surface of the semiconductor substrate 20, formed is a drain electrode 13 with a back ohmic electrode 72 interposed therebetween.

In FIG. 4, a unit structure (unit cell) shown on the right side (which corresponds to the cell region) is the same as the structure shown in FIG. 3, and a structure shown on the left side is a structure which surrounds the cell region in a plan view. The structure on the left side is not an essential element.

On the semiconductor substrate 20 formed of low-resistance silicon carbide of n type, i.e., the first conductivity type, formed is the drift layer 21 formed of n-type silicon carbide.

The second well region 42 formed of silicon carbide of p type, i.e., the second conductivity type, is formed in the surface layer of the drift layer 21. The second well region 42 is so formed apart from the first well region 41 with a predetermined interval therebetween as to surround the cell region. A second well contact region 47 is formed in a surface layer of the second well region 42.

Further, a JTE region 40 (see FIG. 2) is so formed in the surface layer of the drift layer 21 as to surround the second well region 42, and a field stopper region 81 (see FIG. 2) is so formed as to surround the JTE region 40, being apart therefrom.

The gate insulating film 30 is formed on the cell region, extending up to a portion on part of the second well region 42, and a field insulating film 31 is so formed in a region ranging from a portion on part of the second well region 42 to another portion on the field stopper region 81, as to surround the gate insulating film 30 in a plan view. The gate electrode 50 is formed on part of the gate insulating film 30, extending up to a portion on part of the field insulating film 31.

The interlayer insulating film 32 is formed extending from a portion on the cell region to another portion on the field stopper region 81, except the source contact hole 61, the well contact hole 62, and the gate contact hole 64. In other words, the holds are so formed as to penetrate through the interlayer insulating film 32.

The source pad 10 penetrates through the interlayer insulating film 32 in the source contact hole 61 which digs into the source region 80 and the first well contact region 46, and the ohmic electrode 71 is formed on a bottom surface thereof. The residual compressive stress layer 90 is formed on the side surface of the source contact hole 61, i.e., the side surface of the source pad 10.

Further, the source pad 10 penetrates through the interlayer insulating film 32 in the well contact hole 62 which digs into the second well contact region 47, and the ohmic electrode 71 is formed on the bottom surface thereof. The residual compressive stress layer 90 is also formed on a side surface of the well contact hole 62, i.e., the side surface of the source pad 10.

Therefore, the first well region 41 and the second well region 42 are electrically connected to each other through the source contact hole 61 and the well contact hole 62.

The gate wiring line 12 penetrates through the interlayer insulating film 32 in the gate contact hole 64 and is connected to the gate electrode 50. Further, the residual compressive stress layer 90 can be formed on a side surface of the gate contact hole 64, i.e., a side surface of the gate wiring line 12, but the residual compressive stress layer 90 may not be formed on this side surface.

On the other hand, on the back surface of the semiconductor substrate 20, formed is the drain electrode 13 with the back ohmic electrode 72 interposed therebetween.

A-2. Manufacturing Method

Figure 5:
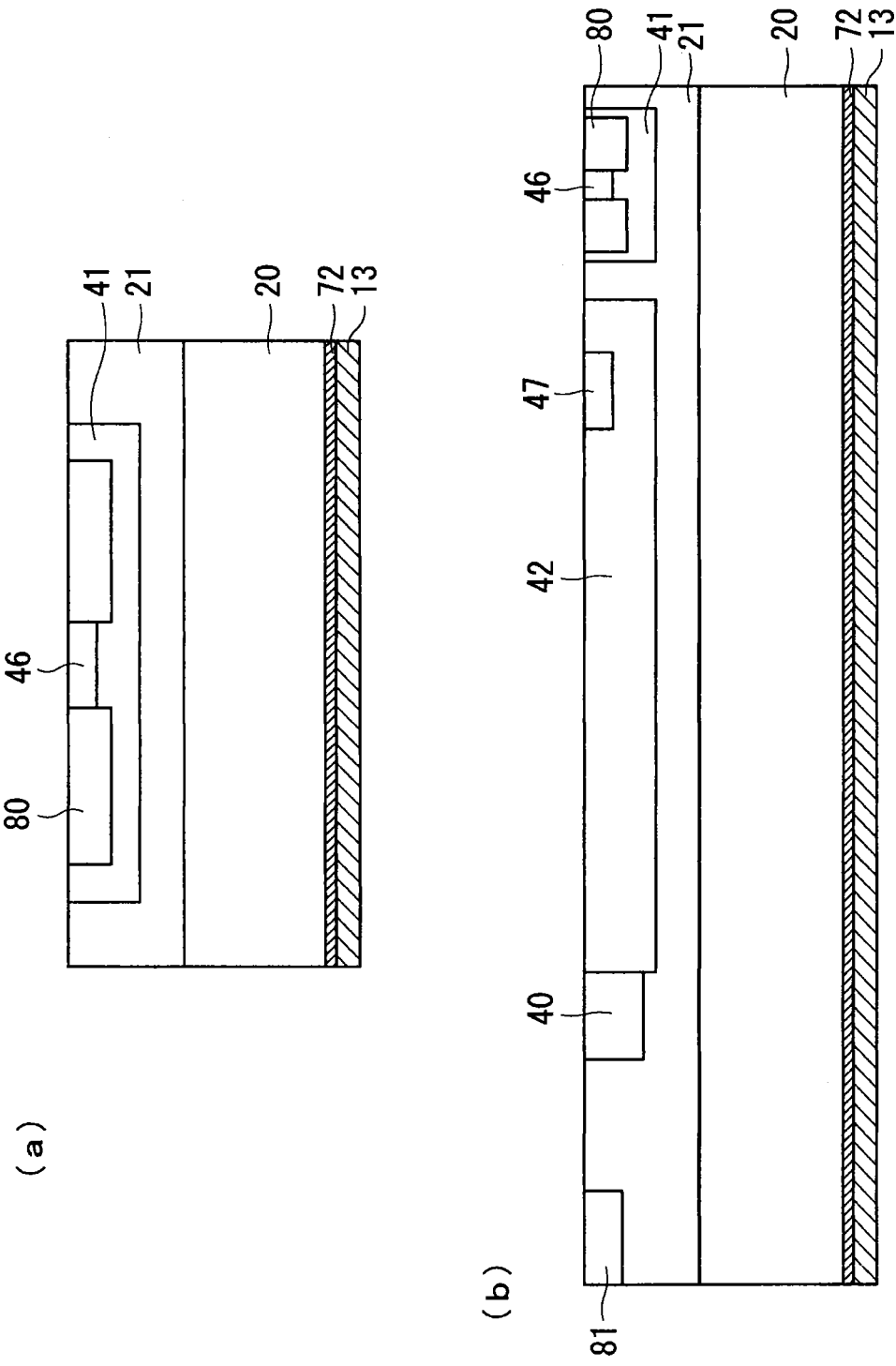
FIG. 5 is a sectional view schematically showing part of a power semiconductor device used for explanation of a process of manufacturing the semiconductor device in accordance with the first preferred embodiment of the present invention.
Figure 6:
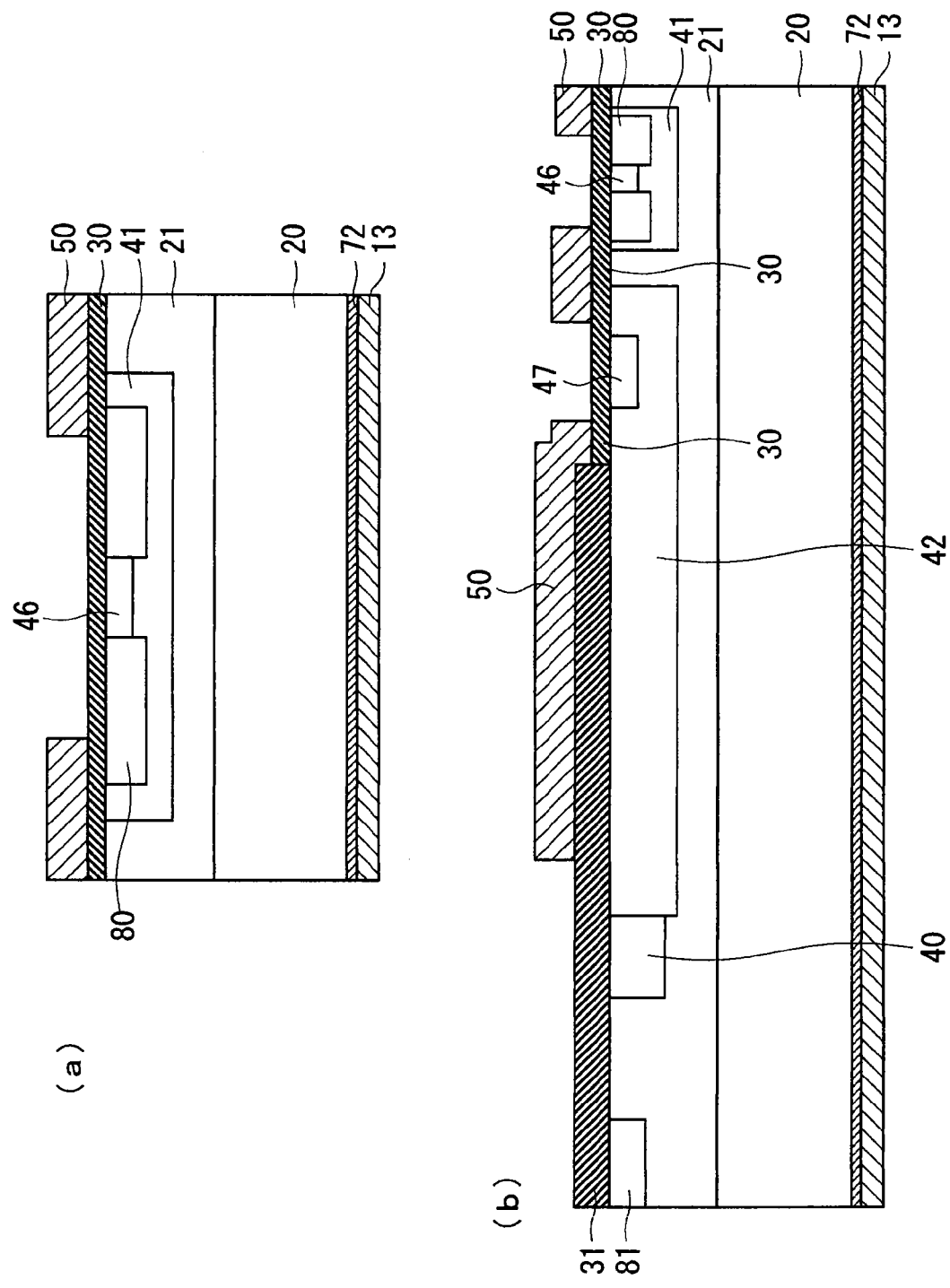
FIG. 6 is a sectional view schematically showing part of the power semiconductor device used for explanation of the process of manufacturing the semiconductor device in accordance with the first preferred embodiment of the present invention.

Next, with reference to FIGS. 5 and 6, discussion will be made on a method of manufacturing the semiconductor device of the present invention. FIGS. 5 and 6 are sectional views schematically showing part of a power semiconductor device, which are particularly used for explanation of a process of manufacturing the power semiconductor device.

Part (a) of FIG. 5 and part (a) of FIG. 6 correspond to the A-A' section of FIG. 2, and part (b) of FIG. 5 part (b) of FIG. 6 correspond to the B-B' section of FIG. 2.

First, on (a first main surface of) the semiconductor substrate 20 of n-type low-resistance silicon carbide, the drift layer 21 of silicon carbide is epitaxially grown to have an n-type impurity concentration ranging from $1\times10^{13}$ cm$^{-3}$ to $1\times10^{18}$ cm$^{-3}$ and a thickness of 4 to 200 μm by the CVD (Chemical Vapor Deposition) method.

Herein, as the above-discussed semiconductor substrate 20 of silicon carbide, used is a semiconductor substrate having the first main surface of 4H polytype which is a (0001) plane in plane orientation, being inclined at 8 degrees or less with respect to the c-axis direction, but a semiconductor substrate having the first main surface of other polytype which is a plane orientation of other than (0001) plane, being inclined at a different angle or not being inclined, may be used.

Subsequently, as shown in parts (a) and (b) of FIG. 5, by ion implantation, the p-type first well region 41, the p-type second well region 42, and the p-type JTE region 40 are formed, the n-type source region 80 and the n-type field stopper region 81 are further formed, and the p-type first well contact region 46 and the p-type second well contact region 47 are still further formed at respective predetermined positions in the surface layer of the drift layer 21. As the p-type impurity to be ion-implanted, aluminum (Al) or boron (B) is suitable, and as the n-type impurity to be ion-implanted, nitrogen (N) or phosphorus (P) is suitable. Further, in the ion implantation process, the semiconductor substrate 20 may not be actively heated, or may be heated at 200 to 800° C.

It is necessary to set the respective depths of the first well region 41 and the second well region 42 to be not deeper than the bottom surface of the drift layer 21 which is an epitaxial crystal growth layer, and to be in a range, e.g., from 0.3 to 2 μm. Further, the respective p-type impurity concentrations of the first well region 41 and the second well region 42 are set to be higher than the impurity concentration of the drift layer 21 and to be in a range from $1\times10^{15}$ cm$^{-3}$ to $1\times10^{19}$ cm$^{-3}$.

The depth of the source region 80 is set so that the bottom surface thereof should not be deeper than the bottom surface of the first well region 41, and the n-type impurity concentration thereof is set to be higher than the p-type impurity concentration of the first well region 41 and to be in a range from $1\times10^{17}$ cm$^{-3}$ to $1\times10^{21}$ cm$^{-3}$.

The field stopper region 81 may be formed under the same conditions as those of the source region 80.

In the vicinity of the outermost surface of the drift layer 21, however, the respective p-type impurity concentrations of the first well region 41 and the second well region 42 may be lower than the n-type impurity concentration of the drift layer 21 so as to increase the conductivity in a channel region of the MOSFET.

The first well contact region 46 and the second well contact region 47 are provided so as to establish an excellent electrical contact between the first well region 41 and the second well region 42, and the source pad 10 with the ohmic electrode 71 interposed therebetween, respectively, and it is preferable that the impurity concentrations of the first well contact region 46 and the second well contact region 47 should be higher than the p-type impurity concentrations of the first well region 41 and the second well region 42, respectively.

Further, in the process of ion-implanting these high-concentration impurities, it is preferable that the semiconductor substrate 20 should be heated up to 150° C. or higher in order to make the respective resistances of the first well contact region 46 and the second well contact region 47 lower.

Subsequently, in an inert gas atmosphere of argon (Ar) gas or nitrogen gas and the like or in a vacuum, annealing is performed at a temperature ranging from 1500 to 2200° C. for 0.5 to 60 minutes, to thereby electrically activate the ion-implanted impurities. The annealing may be performed with the semiconductor substrate 20 and the films formed thereon covered with a carbon film. By performing the annealing using the carbon film to cover the semiconductor substrate 20 and the films, it is possible to prevent occurrence of roughness on the silicon carbide surface, which is caused by residual water, residual oxygen, and/or the like in an apparatus used for the annealing.

Next, sacrificial oxidation is performed on the surface of the drift layer 21 which has been ion-implanted as above, to thereby form a thermal oxide film, and then the thermal oxide film is removed by hydrofluoric acid, to thereby remove a surface alteration layer of the ion-implanted drift layer 21 and expose a clean surface thereof.

Subsequently, a silicon dioxide film (field insulating film 31) is formed to have a thickness of about 0.5 to 2 μm in a region other than the position which almost corresponds to the above-discussed cell region by the CVD method, the photolithography technique, or the like. At that time, for example, after forming the field insulating film 31 entirely on the surface, the field insulating film 31 formed at the position which almost corresponds to the cell region may be removed by photolithography, etching, or the like.

Subsequently, the gate insulating film 30 is formed of a silicon dioxide film to have a thickness smaller than that of the field insulating film 31, e.g., of about one tenth of the thickness of the field insulating film 31, in an active region centering on the cell region by a thermal oxidation method or a deposition method.

The thickness of the gate insulating film 30 has only to be not smaller than 30 nm and not larger than 300 nm, and more preferably, should be not smaller than 50 nm and not larger than 150 nm. The thickness value depends on the gate voltage and the gate electric field to drive the MOSFET (perform a switching operation), and preferably, the gate electric field (the electric field to be applied to the gate insulating film 30) should be not larger than 3 MV/cm.

Subsequently, as shown in parts (a) and (b) of FIG. 6, the gate electrode 50 of polycrystalline silicon material is formed at a predetermined portion on the gate insulating film 30 and the field insulating film 31 by the CVD method, the photolithography technique, or the like. It is preferable that the polycrystalline silicon used for the gate electrode should have a low resistance, containing phosphorus (P) or boron (B). Phosphorus (P) or boron (B) may be injected during formation of the film of polycrystalline silicon or may be injected by ion implantation or the like after formation of the film. Further, the gate electrode 50 may be a multilayer film of polycrystalline silicon and metal or a multilayer film of polycrystalline silicon and metal silicide.

An outermost end surface of the gate electrode 50 may be disposed on the field insulating film 31. With this arrangement, it is possible to prevent deterioration in the quality of the gate insulating film 30 which is exposed at an end surface by overetching of the end surface in a dry etching process.

Next, the interlayer insulating film 32 made of a silicon dioxide film is formed on the gate electrode 50 by a deposition method such as the CVD method. Subsequently, the interlayer insulating film 32 formed at the portions to become the source contact hole 61 and the well contact hole 62 is removed by the photolithography technique and the dry etching technique.

Further, the layer below the source contact hole 61 (above the first well contact region 46 and the surrounding portion thereof) is dug by dry etching. This process step may be performed independently of the etching of the interlayer insulating film 32, or may be performed in succession by using the same apparatus and the same etching gas. When the process is performed independently, by changing the etching gas to be used, the etching gases and the etching conditions most suitable for the etching of the interlayer insulating film 32 and that of the layer below the source contact hole 61, respectively, can be selected, and it is expected that reduction in the etching time and improvement in the reproducibility can be thereby achieved. On the other hand, when the etching processes are performed in succession, it is possible to reduce the time required for loading and unloading to/from the etching apparatus.

It is preferable that the depth of dry etching should be deeper than 5 nm from the surface layer of the semiconductor layer and shallower than the source region 80 and the first well contact region 46. The reason why the depth is preferably deeper than 5 nm is that a surface of silicide which is formed at the bottom surface of the source contact hole 61 as the ohmic electrode 71 should be positioned deeper than a surface of the channel portion.

In order to form silicide, generally, it is necessary to deposit nickel of 10 nm or more and then perform a heat treatment. Since silicide reaction is a reaction of mixing the deposited nickel with the layer therebelow (silicon carbide), a surface of nickel silicide is formed at a position higher than the surface of the silicon carbide before the deposition by half of the film thickness of the deposited nickel. Therefore, it is preferable that the silicon carbide at the contact bottom should be etched in advance up to the depth deeper than 5 nm.

The reason why the depth is preferably shallower than the source region 80 and the first well contact region 46 is to prevent an increase in the contact resistance which is caused by the absence of the source region 80 and the first well contact region 46.

Next, a metal film made mainly of nickel (Ni) is formed by a sputtering method, and subsequently a heat treatment is performed at a temperature ranging from 600 to 1100° C., to thereby react the metal film made mainly of nickel (Ni) with the silicon carbide layer. Then, silicide is formed between the silicon carbide layer and the metal film.

Subsequently, the metal film remaining on the interlayer insulating film 32, other than the silicide formed by the reaction, is removed by wet etching with either one of sulfuric acid, nitric acid, and hydrochloric acid, a mixed solution of the one and oxygenated water, or the like. As discussed above, the surface of the silicide formed inside the source contact hole 61 is positioned deeper than the silicon carbide surface (drift layer) of the channel portion.

Thus, the silicide formed inside the source contact hole 61 and the well contact hole 62 becomes the ohmic electrode 71 shown in FIGS. 3 and 4 and is ohmically connected to both the n-type silicon carbide region such as the source region 80 and the like and the p-type silicon carbide region such as the first well region 41 and the like.

Further, the interlayer insulating film 32 formed at the portion to become the gate contact hole 64 is removed by the photolithography technique and the dry etching technique. Subsequently, a metal made mainly of nickel (Ni) is formed on a back surface (second main surface) of the semiconductor substrate 20 and then a heat treatment is performed, to thereby form the back ohmic electrode 72 on the back surface of the semiconductor substrate 20.

After that, in order to reduce the contact resistance between the silicide formed inside the source contact hole 61 and the well contact hole 62 and a metal electrode to be formed later, an oxide formed on the silicide by the thermal process is removed by reverse sputter etching (reverse sputter etching process).

At that time, in order to reduce a damage to be caused on the semiconductor device, the input energy per unit area in the reverse sputter etching, i.e., a value obtained by dividing total input energy by the area of the sputter electrode should be preferably 2 W/cm$^2$ or less, and more preferably 0.5 W/cm$^2$ or less.

After that, titanium (Ti) in which the compressive stress remains is deposited. At that time, titanium (Ti) is deposited not only on an upper surface of the interlayer insulating film 32 but also necessarily on a side surface thereof.

It is preferable that the thickness of the film to be formed on the side surface of the interlayer insulating film 32 should be 20 nm or more so as to apply a sufficient force to the interlayer insulating film 32 in a direction perpendicular to the main surface of the semiconductor substrate 20 (silicon carbide).

As one exemplary method of depositing the titanium (Ti) on the side surface of the interlayer insulating film 32, a sputtering method is used. In this case, in order to cause the compressive stress to remain in the titanium (Ti), the sputtering pressure should be preferably low. If the sputtering pressure is high, gas is mixed into the titanium (Ti) film, and degassing and contraction of the film occur when the device is taken out from the sputtering apparatus. As a result, the residual compressive stress in the titanium (Ti) is reduced and further a tensile stress becomes apt to remain.

FIG. 7 is a graph in which a residual stress (MPa) in the titanium (Ti) thin film which is obtained from the warp of the semiconductor substrate after depositing the titanium (Ti) thin film on the semiconductor substrate is plotted with respect to the sputtering pressure (Pa).

As shown in FIG. 7, it is found that when the sputtering pressure is 1.2 Pa or less, the compressive stress remains and a useful residual compressive stress layer 90 can be obtained.

After that, by high-directivity dry etching, the titanium (Ti) deposited on the upper surface of the interlayer insulating film 32 and the bottom surface of the source contact hole 61 is removed and part of the titanium (Ti) deposited on the side surface of the interlayer insulating film 32 is left.

After that, a conductive material to become the source pad 10, the gate pad 11, and the gate wiring line 12 is deposited on the surface of the semiconductor substrate 20, and the conductive material is processed into respective shapes of the source pad 10, and the gate pad 11, and the gate wiring line 12 by the photolithography technique and the etching technique. As one exemplary conductive material, used is aluminum which has excellent conductivity and is easy to be wire-bonded. Further, nickel which can be directly soldered to the source pad is also suitable.

Finally, a metal film is formed on the back ohmic electrode 72 formed on the back surface of the substrate, to thereby form the drain electrode 13, and the power semiconductor device shown in FIGS. 3 and 4 is thus completed.

Though titanium (Ti) is taken as an example of the material for the residual compressive stress layer 90 to be deposited on the side surface of the interlayer insulating film 32, any metal material other than titanium (Ti) may be used only if the material has a compressive stress. Further, in this preferred embodiment, since electrical conduction between the source pad 10 and the ohmic electrode 71 is achieved not through the residual compressive stress layer 90, the conductivity of the residual compressive stress layer 90 does not matter. In other words, even an insulating film may be used only if a compressive stress remains therein.

Further, though the sputtering method is taken as an example of the deposition method for forming a thin film on the side surface of the interlayer insulating film 32, the method is not limited to the sputtering method. The vacuum deposition method, the CVD method, the electroplating method, or the like may be used only if this is a method of forming a thin film on the side surface of the interlayer insulating film 32.

A-3. Operation

Figure 11:
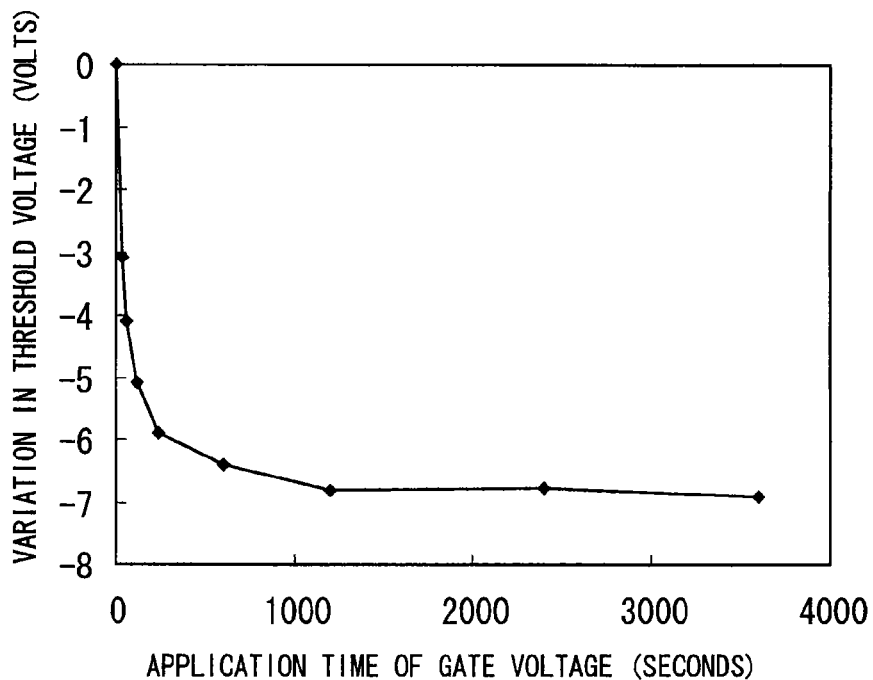
FIG. 11 is a graph showing time variation in the threshold voltage of a semiconductor device.

FIG. 11 shows time variation of a threshold voltage which is obtained by applying a voltage of −20 V (negative bias) to the gate electrode in the MOSFET and repeatedly measuring the threshold voltage in this condition.

In this MOSFET, as an electrode material for the source pad 10, used is aluminum (Al) which is deposited by the sputtering method, in which a tensile stress of 42 MPa remains.

As shown in FIG. 11, it is found that the threshold voltage gradually decreases and about −7 V is changed from the original property in one hour. It is thought that positive holes are trapped in the gate insulating film of the channel portion and a gate voltage required to carry the equivalent drain current is changed by the voltage to compensate the positive hole charges.

As long as the inventor and the like research, there is no report that a remarkable variation in the threshold voltage, i.e., a change of about −7 V, is caused by applying a negative bias to the gate electrode in the MOSFET using silicon carbide, and there is also no solution thereof.

Since such a variation in the threshold voltage is thought to disturb operations of apparatuses equipped with the semiconductor devices, this problem is very serious.

For prevention of formation of the trap level which causes such a variation in the threshold voltage, first, discussion will be made on the mechanism (of forming the trap level).

Between the drift layer 21 used as the semiconductor layer and the gate insulating film 30, there is a distortion caused by, for example, lattice mismatch between the silicon carbide and the material for a gate oxide film. By this lattice distortion, the interatomic distance of the silicon carbide which is in contact with the gate oxide film becomes a distance different from the interatomic distance of the silicon carbide in a bulk, and an energy level different from that in the bulk is formed due to the distance. When this new energy level is formed in a forbidden band of the silicon carbide, the energy level functions as an interface state.

Since the interface state traps electric charges with a certain time constant, when such an interface state is formed in the channel portion, this causes the above-discussed variation in the threshold voltage. Particularly, since the silicon carbide has a band gap wider than that of silicon and there is strong possibility that the energy level formed in an interface between the gate oxide film and the silicon carbide functions as an interface state, it is important to control a lattice distortion in the interface.

On the other hand, when comparison is made between the interatomic distance of the silicon carbide and that of a material which is generally used for the gate oxide film, such as silicon dioxide, the interatomic distance of the silicon carbide is larger by 5.6% and therefore the compressive stress remains in the silicon carbide which is in contact with the silicon dioxide. It is thought that the interatomic distance of the silicon carbide in the vicinity of the silicon dioxide (the silicon carbide in contact with the silicon dioxide) is narrowed in a direction parallel to the main surface of the semiconductor substrate as compared with that in the bulk and this causes an interface state to be formed.

In this preferred embodiment, therefore, in the region where the channel is formed, the interface between the gate insulating film 30 and the first well region 41, and the interface between the gate insulating film 30 and the source region 80, a force is applied in a direction to draw the two elements apart from each other.

By drawing the gate insulating film 30 and the semiconductor surface in contact therewith apart from each other in the direction perpendicular to the main surface, the compression imposed on the semiconductor layer whose interatomic distance is narrowed is relieved in the channel portion and the state of the semiconductor layer comes near to a state of having the original interatomic distance. This reduces the trap level and suppresses a variation in the threshold voltage.

As a method of drawing the gate insulating film 30 and the semiconductor surface apart from each other, provided is a method in which, first, the bottom surface of the source contact hole 61 is dug deeper than the surface layer of the drift layer 21 and further the residual compressive stress layer 90 is formed on side surface of the source contact hole 61. With such formation, the residual compressive stress layer 90 is disposed in a range of the lower and upper layers of the contact surface between the gate insulating film 30 and the semiconductor surface, and it is possible, by this residual stress, to draw the gate insulating film 30 and the semiconductor surface apart from each other in the direction perpendicular to the main surface.

In order to demonstrate the effect of this structure, the following verification is performed.

First, the process steps immediately before the deposition of the source pad 10 are executed on three samples (samples A to C). In the formation of the source contact hole 61, the silicon carbide at the bottom surface of the source contact hole 61 is etched by 30 nm by dry etching.

After that, aluminum (Al) having a thickness of 3 μm is deposited on the sample A by the sputtering method and on the sample B by vacuum deposition method. On the other hand, titanium (Ti) having a thickness of 50 nm is deposited on the sample C by the sputtering method and then aluminum (Al) having a thickness of 3 μm is deposited thereon by the sputtering method.

Next, these aluminum (Al) and titanium (Ti) are processed into respective shapes of the source pad 10, and the gate pad 11, and the gate wiring line 12 by the photolithography technique.

Finally, a metal film is formed on the back ohmic electrode 72 formed on the back surface of the semiconductor substrate, to thereby form the drain electrode 13, and three MOSFETs are thus completed.

By calculation of respective film stresses of these aluminum (Al) and titanium (Ti) from the warp of the substrate, it is found that a tensile stress of 42 MPa remains in the aluminum (Al) of the sample A, a compressive stress of 32 MPa remains in the aluminum (Al) of the sample B, and a compressive stress of 180 MPa remains in the titanium (Ti) of the sample C.

By using these MOSFETs, a voltage of −20 V is applied to the gate electrode in the same manner as that in the above-discussed measurement, and the threshold voltage is repeatedly measured.

Figure 12:
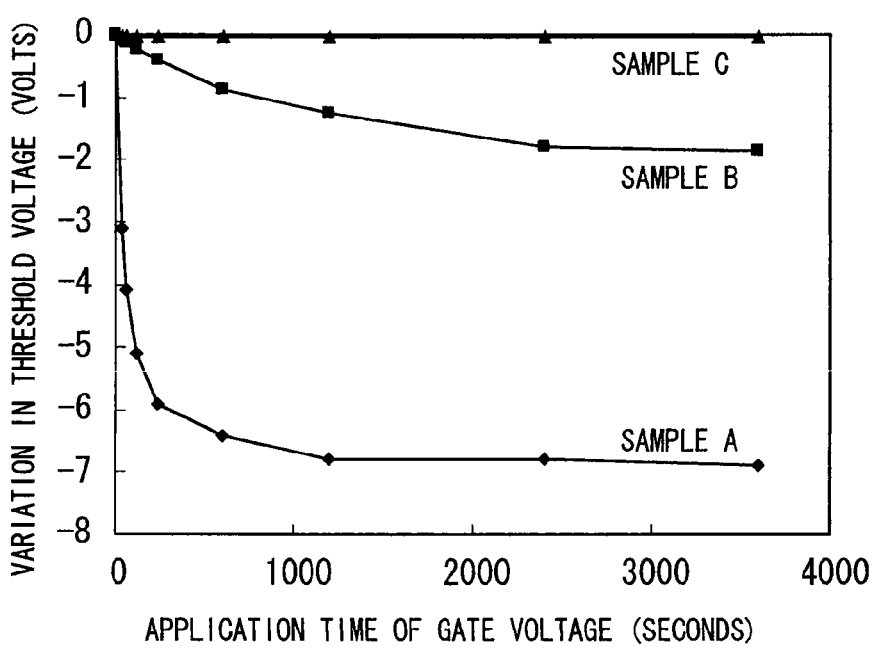
FIG. 12 is a graph showing respective time variations in the threshold voltages of semiconductor devices.

As a result, as shown in FIG. 12, while a remarkable variation in the threshold voltage, i.e., a change of 7 V, is caused in the sample A with the aluminum (Al) deposited thereon in which the tensile stress remains, a smaller variation in the threshold voltage, i.e., a change of about 2 V, is caused in the sample B with the aluminum (Al) deposited thereon in which the compressive stress of 32 MPa remains, and in the sample C on which the titanium (Ti) in which the compressive stress of 180 MPa remains is deposited and then the aluminum (Al) is formed by the sputtering method, the variation in the threshold voltage is reduced to 0.1 V or less.

It is thought that the improvements in the samples B and C are caused by the respective compressive stresses remaining in the materials formed on the side surface of the interlayer insulating film 32. Further, from these results, it is found that by causing the compressive stress of 32 MPa or more to remain, it is possible to reduce the variation in the threshold voltage to 1 V or less.

Though the exemplary case of MOSFET has been discussed herein, also in a case of using an IGBT, since the structure on the side of the main surface is the same as that in the case of MOSFET, it is easily expected that the same effects can be produced.

Though the side surface of each contact hole, in other words, the side surface of the interlayer insulating film 32 (i.e., the side surface of the source contact hole 61) is shown to be perpendicular to the main surface of the semiconductor substrate 20 in the views showing the structure of this preferred embodiment, the side surface of the interlayer insulating film 32 may not be necessarily perpendicular to (at an angle of 90 degrees with) the main surface of the semiconductor substrate 20 but may have an angle of 10 degrees or more therewith.

Further, in the power semiconductor device, there is a case where a temperature sensor electrode and a current sensor electrode are formed in part of the power semiconductor device. These electrodes may be formed in the power semiconductor device of this preferred embodiment. Whether the temperature sensor electrode and the current sensor electrode are formed or not does not affect the effects of the semiconductor device of this preferred embodiment.

A-4. Effects

Since the semiconductor device in accordance with this preferred embodiment of the present invention comprises the drift layer 21 formed on the semiconductor substrate 20, the first well regions 41 formed in the surface layer of the drift layer 21, being apart from one another, the gate insulating film 30 formed extending on the drift layer 21 and each of the first well regions 41, the gate electrode 50 selectively formed on the gate insulating film 30, the source contact hole 61 penetrating through the gate insulating film 30 and reaching the inside of each of the first well regions 41, and the residual compressive stress layer 90 formed on at least the side surface of the source contact hole 61, in which the compressive stress remains, it is possible to reduce the lattice mismatch between the gate insulating film 30 (silicon dioxide) and the semiconductor layer and reduce the variation in the threshold voltage.

Further, by reducing the interface trap level which occurs in the interface between the semiconductor layer and the gate insulating film 30, it is thought that it is possible to reduce the lattice mismatch between the gate insulating film 30 (silicon dioxide) and the semiconductor layer.

Since the semiconductor device in accordance with this preferred embodiment of the present invention further comprises the source region 80 of the first conductivity type selectively formed in the surface layer of each of the first well regions 41 and in the semiconductor device, the gate insulating film 30 is formed, extending on the source region 80, and the source contact hole 61 reaches the depth deeper than 5 nm from the surface layer of the drift layer 21 inside the source region 80, the residual compressive stress layer 90 is disposed in a range of the lower and upper layers of the contact surface between the gate insulating film 30 and the semiconductor surface, and it is possible, by this residual stress, to draw the gate insulating film 30 and the semiconductor surface apart from each other in the direction perpendicular to the main surface.

Since the semiconductor device in accordance with this preferred embodiment of the present invention further comprises the first well contact region 46 of the second conductivity type selectively formed in the surface layer of each of the first well regions 41, being surrounded by the source region 80 in a plan view and in the semiconductor device, the source contact hole 61 reaches the depth deeper than 5 nm from the surface layer of the drift layer 21 inside the first well contact region 46, the residual compressive stress layer 90 is disposed in a range of the lower and upper layers of the contact surface between the gate insulating film 30 and the semiconductor surface, and it is possible, by this residual stress, to draw the gate insulating film 30 and the semiconductor surface apart from each other in the direction perpendicular to the main surface.

Since the residual compressive stress layer 90 is not formed on the bottom surface of the source contact hole 61 in the semiconductor device in accordance with this preferred embodiment of the present invention, the electrical conduction between the source pad 10 and the ohmic electrode 71 is achieved not through the residual compressive stress layer 90, and therefore the conductivity of the residual compressive stress layer 90 does not matter and the degree of freedom in selection increases.

Since the compressive stress not lower than 32 MPa remains in the residual compressive stress layer 90 in the semiconductor device in accordance with this preferred embodiment of the present invention, it is possible to reduce the variation in the threshold voltage to 1 V or less.

Since the method of manufacturing a semiconductor device in accordance with this preferred embodiment of the present invention comprises the step of forming the source contact hole 61 by etching so that the source contact hole 61 should reach the depth deeper than 5 nm from the surface layer of the drift layer 21 inside the source region 80, the residual compressive stress layer 90 is disposed in a range of the lower and upper layers of the contact surface between the gate insulating film 30 and the semiconductor surface, and it is possible, by this residual stress, to draw the gate insulating film 30 and the semiconductor surface apart from each other in the direction perpendicular to the main surface.

Further, since the method of manufacturing a semiconductor device in accordance with this preferred embodiment of the present invention comprises the step of depositing the residual compressive stress layer 90 by the sputtering method using titanium (Ti) and in the step, the sputtering pressure is 1.2 Pa or less, it is possible to cause the compressive stress to appropriately remain in the residual compressive stress layer 90 and reduce the time variation in the threshold voltage of the gate electrode 50.

B. The Second Preferred Embodiment

B-1. Structure

Part (a) of FIG. 8 is a modified view schematically showing a cross section of the portion A-A' in the schematic plan view of FIG. 2, and part (b) of FIG. 8 is a modified view schematically showing a cross section of the portion B-B' in the schematic plan view of FIG. 2.

In the second preferred embodiment, a plug 91 (buried wiring) in which a compressive stress remains is formed in each of the contact holes, other than on the upper surface of the interlayer insulating film 32. The plug 91 is formed up to the bottom surface of the contact hole.

In the case where the contact is established by the plug 91, it is not necessary to dispose both the residual compressive stress layer formed on the side surface of the contact hole and the source pad (metal electrode) in the contact hole as discussed in the first preferred embodiment. Since the compressive stress remains in the plug 91, a film (or layer) in which the compressive stress remains can be formed on the side surface of the contact hole, i.e., the side surface of the interlayer insulating film 32, even in a smaller contact hole.

B-2. Manufacturing Method

Discussion will be made below on a method of manufacturing this structure. The process steps up to the step (reverse sputter etching process) in which "the oxide formed on the silicide by the thermal process is removed by reverse sputter etching in order to reduce the contact resistance between the silicide formed inside the source contact hole 61 and the well contact hole 62 and the metal electrode to be formed later" are the same as those in the first preferred embodiment.

After that, titanium (Ti) in which a compressive stress remains is deposited by the sputtering method. The thickness of the titanium (Ti) should be preferably half of that of the interlayer insulating film 32 or more, and more preferably should be equal to or larger than the thickness of the interlayer insulating film 32.

Subsequently, the titanium (Ti) deposited on the upper surface of the interlayer insulating film 32 is removed by CMP (Chemical Mechanical Polishing). Then, the plug 91 is formed.

After that, like in the first preferred embodiment, a conductive material to become a source pad 101, a gate pad, and a gate wiring line 103 is deposited on the surface of the semiconductor substrate 20, and the conductive material is processed into respective shapes of the source pad 101, and the gate pad, and the gate wiring line 103 by the photolithography technique and the etching technique.

Finally, a metal film is formed on the back ohmic electrode 72 formed on the back surface of the substrate, to thereby form the drain electrode 13, and the power semiconductor device shown in the sectional view of FIG. 8 is thus completed.

Further, the plug 91 of titanium (Ti) may be formed inside the gate contact hole 64 or may not be formed therein.

In the case where the plug 91 is formed inside the gate contact hole 64, the plug 91 can function as a barrier layer for preventing a reaction from occurring between the gate wiring line 103 and the gate electrode 50.

On the other hand, in the case where the plug 91 of titanium (Ti) is not formed inside the gate contact hole 64, a low contact resistance can be achieved by direct contact between the gate wiring line 103 and the gate electrode 50.

One of these two cases can be selectively performed by changing the execution order of the process step of forming the gate contact hole 64, the process step of depositing the titanium (Ti), and the process step of performing CMP. In other words, in order to form the plug 91 of titanium (Ti) inside the gate contact hole 64, the plug 91 may be formed in the same manner as in the case where the plug 91 is formed inside the source contact hole 61 and the well contact hole 62, along the above-discussed manufacturing method. On the other hand, in order not to form the plug 91 of titanium (Ti) inside the gate contact hole 64, the process steps of depositing the titanium (Ti) and of performing CMP are performed before the formation of the gate contact hole 64.

B-3. Effects

Since the plug 91 serving as the residual compressive stress layer is formed on the bottom surface of the source contact hole 61 in the semiconductor device in accordance with this preferred embodiment of the present invention, it is not necessary to form a multilayer structure inside the contact hole, and the film (or layer) in which the compressive stress remains can be formed on the side surface of the contact hole, i.e., the side surface of the interlayer insulating film 32, even in a smaller contact hole.

C. The Third Preferred Embodiment

C-1. Structure

Part (a) of FIG. 9 is a modified view schematically showing a cross section of the portion A-A' in the schematic plan view of FIG. 2, and part (b) of FIG. 9 is a modified view schematically showing a cross section of the portion B-B' in the schematic plan view of FIG. 2.

In the third preferred embodiment, a metal electrode layer (single layer 100) in which a compressive stress remains is formed continuously on the bottom surface of each of the contact holes, the side surface of each of the contact holes, i.e., the side surface of the interlayer insulating film 32, and the upper surface of the interlayer insulating film 32, to perform respective functions of a source pad, a gate pad, and a gate wiring line. By forming the metal electrode layer in such a manner, it is possible to reduce the number of process steps for manufacturing the semiconductor device and reduce the cost therefor.

Further, the single layer 100 may not be formed inside the gate contact hole 64.

C-2. Manufacturing Method

Discussion will be made below on a method of manufacturing this structure. The process steps up to the step (reverse sputter etching process) in which "the oxide formed on the silicide by the thermal process is removed by reverse sputter etching in order to reduce the contact resistance between the silicide formed inside the source contact hole 61 and the well contact hole 62 and the metal electrode to be formed later" are the same as those in the first preferred embodiment.

After that, titanium (Ti) in which a compressive stress remains is deposited by the sputtering method. At that time, the titanium (Ti) is deposited not only on the upper surface of the interlayer insulating film 32 but also necessarily on the side surface thereof. It is preferable that the thickness of the titanium (Ti) to be formed on the side surface of the interlayer insulating film 32 should be 20 nm or more so as to apply a sufficient stress thereto.

After that, the titanium (Ti) is processed into respective shapes of the source pad, and the gate pad, and the gate wiring line by the photolithography technique and the etching technique, to thereby form the single layer 100.

Finally, a metal film is formed on the back ohmic electrode 72 formed on the back surface of the substrate, to thereby form the drain electrode 13, and the power semiconductor device shown in the sectional view of FIG. 9 is thus completed.

C-3. Effects

Since the semiconductor device in accordance with this preferred embodiment of the present invention further comprises the interlayer insulating film 32 which is so formed as to cover the gate insulating film 30 and the gate electrode 50 and in the semiconductor device, the single layer 100 which performs the function of the residual compressive stress layer is also formed on the upper surface of the interlayer insulating film 32, it is possible to reduce the number of process steps for manufacturing the semiconductor device and reduce the cost therefor.

D. The Fourth Preferred Embodiment

D-1. Structure

Part (a) of FIG. 10 is a modified view schematically showing a cross section of the portion A-A' in the schematic plan view of FIG. 2, and part (b) of FIG. 10 is a modified view schematically showing a cross section of the portion B-B' in the schematic plan view of FIG. 2.

In the fourth preferred embodiment, a residual compressive stress layer 92 (metal electrode) in which a compressive stress remains is formed continuously on the bottom surface of each of the contact holes, the side surface of each of the contact holes, i.e., the side surface of the interlayer insulating film 32, and the upper surface of the interlayer insulating film 32, and further a different electrode material (metal material for a source pad 102 and the like) is layered thereon.

With such formation, the residual compressive stress layer 92 and each of the source pad 102, a gate pad, and a gate wiring line 104 can be separately selected.

D-2. Manufacturing Method

Discussion will be made below on a method of manufacturing this structure. The process steps up to the step (reverse sputter etching process) in which "the oxide formed on the silicide by the thermal process is removed by reverse sputter etching in order to reduce the contact resistance between the silicide formed inside the source contact hole 61 and the well contact hole 62 and the metal electrode to be formed later" are the same as those in the first preferred embodiment.

After that, titanium (Ti) in which a compressive stress remains is deposited by the sputtering method. At that time, the titanium (Ti) is deposited not only on the upper surface of the interlayer insulating film 32 but also necessarily on the side surface thereof.

It is preferable that the thickness of the film to be formed on the side surface of the interlayer insulating film 32 should be 20 nm or more so as to apply a sufficient force to the interlayer insulating film 32 in a direction perpendicular to the main surface of the semiconductor substrate 20.

After that, an aluminum (Al) electrode, for example, is formed. It is preferable that the aluminum (Al) electrode should have a thickness of 1 μm or more in order to achieve a wire bond having sufficient strength.

Then, the aluminum (Al) electrode and the titanium (Ti) electrode are processed into respective shapes of the source pad 102, and the gate pad, and the gate wiring line 104 by the photolithography technique and the etching technique.

The aluminum (Al) and the titanium (Ti) may be etched by using the same pattern resist, or may be etched separately by using different resist patterns which are formed.

Finally, a metal film is formed on the back ohmic electrode 72 formed on the back surface of the substrate, to thereby form the drain electrode 13, and the power semiconductor device shown in the sectional view of FIG. 10 is thus completed.

In the case where the etching is performed by using the same pattern resist, the titanium (Ti) electrode is formed inside the gate contact hole 64 and serves as a barrier layer for preventing a reaction from occurring between the gate wiring line 104 and the gate electrode 50.

Further, the titanium (Ti) may be formed inside the gate contact hole 64, or may not be formed therein.

In the case where the titanium (Ti) is formed inside the gate contact hole 64, the titanium (Ti) can function as the barrier layer for preventing a reaction from occurring between the gate wiring line 104 and the gate electrode 50.

On the other hand, in the case where the titanium (Ti) is not formed inside the gate contact hole 64, a low contact resistance can be achieved by direct contact between the gate wiring line 104 and the gate electrode 50.

In accordance with the above-discussed manufacturing method, the semiconductor device in which the titanium (Ti) is formed inside the gate contact hole 64 is completed. On the other hand, after the titanium (Ti) is deposited, a resist pattern dedicated to exposure of the titanium (Ti) formed inside the gate contact hole 64 is formed and the titanium (Ti) electrode is thereby etched, and after that, the aluminum (Al) is deposited and etched by using a different resist pattern. Thus, the semiconductor device in which the titanium (Ti) is not formed inside the gate contact hole 64 is completed.

Further, by using the aluminum (Al) in which the tensile stress remains as an electrode material, it is also possible to reduce the convex warp of the semiconductor substrate due to the titanium (Ti) in which the compressive stress remains, which is deposited on an upper layer of the interlayer insulating film 32, and thereby prevent a fracture in the semiconductor substrate.

D-3. Effects

In the semiconductor device in accordance with this preferred embodiment of the present invention, since the residual compressive stress layer 92 is formed on the bottom surface of the source contact hole 61 and the source pad 102 formed of an electrode material different from that of the residual compressive stress layer 92 is layered on the residual compressive stress layer 92, the residual compressive stress layer 92 and each of the source pad 102, the gate pad, and the gate wiring line 104 can be separately selected.

Further, in the semiconductor device in accordance with this preferred embodiment of the present invention, since the source pad 102 is formed of a material in which a tensile stress remains, it is also possible to reduce the convex warp of the semiconductor substrate due to the residual compressive stress layer 92 in which the compressive stress remains, which is deposited on the upper layer of the interlayer insulating film 32, and thereby prevent a fracture in the semiconductor substrate.

In the preferred embodiments of the present invention, the material and the quality thereof of each constituent element, the conditions for carrying out the invention, and the like are discussed, but these are only examples and not restrictive.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS 10, 101, 102 source pad
11 gate pad
12, 103, 104 gate wiring line
13 drain electrode
20 semiconductor substrate
21 drift layer
30 gate insulating film
31 field insulating film
32 interlayer insulating film
40 JTE region
41 first well region
42 second well region
46 first well contact region
47 second well contact region
50 gate electrode
61 source contact hole
62 well contact hole
64 gate contact hole
71 ohmic electrode
72 back ohmic electrode
80 source region
81 field stopper region
90, 92 residual compressive stress layer
91 plug
100 single layer

The invention claimed is:

1. A semiconductor device, comprising:
a silicon carbide semiconductor substrate;
a silicon carbide drift layer of a first conductivity type formed on said silicon carbide semiconductor substrate;
first well regions each of a second conductivity type formed in a surface layer of said silicon carbide drift layer, being apart from one another, to form a plurality of unit cells;
a gate insulating film formed, extending on at least said silicon carbide drift layer and each of said first well regions;
a gate electrode selectively formed on said gate insulating film;
an interlayer insulating film which is formed to cover said gate insulating film and said gate electrode, a source contact hole penetrating through said gate insulating film and reaching the inside of said each of said first well regions; and a residual compressive stress layer formed on at least a side surface of said source contact hole, in which a compressive stress remains and is also formed directly on an upper surface of said interlayer insulating film.

2. The semiconductor device according to claim 1, wherein said residual compressive stress layer is formed on a bottom surface of said source contact hole.

3. The semiconductor device according to claim 1, wherein said residual compressive stress layer is formed on a bottom surface of said source contact hole, and an electrode material different from said residual compressive stress layer is layered on said residual compressive stress layer.

4. The semiconductor device according to claim 1, further comprising:

a cell region in which said plurality of unit cells are arranged; and a second well region of said second conductivity type formed in said surface layer of said silicon carbide drift layer, surrounding said cell region in a plan view, wherein said gate insulating film is formed extending on said second well region.

5. The semiconductor device according to claim 4, further comprising:

a field insulating film formed on said silicon carbide drift layer, surrounding said gate insulating film in a plan view, wherein said gate electrode is formed extending on said field insulating film, said semiconductor device further comprising:

a gate contact hole reaching said gate electrode on said field insulating film, wherein said residual compressive stress layer is also formed in said gate contact hole in the same manner as it is formed in said source contact hole.

6. The semiconductor device according to claim 1, wherein a compressive stress not lower than 32 MPa remains in said residual compressive stress layer.

7. The semiconductor device according to claim 1, wherein said residual compressive stress layer is formed of a laminated layer film consisting of one layer containing Ti or more.

8. The semiconductor device according to claim 1, wherein said residual compressive stress layer is formed of a laminated layer film including a layer containing Al and another layer containing Ti.

9. The semiconductor device according to claim 1, further comprising:

a source region of said first conductivity type selectively formed in a surface layer of each of said first well regions, wherein said gate insulating film is formed, extending on said source region, and said source contact hole reaches the depth deeper than 5 nm from said surface layer of said silicon carbide drift layer inside said source region.

10. The semiconductor device according to claim 9, further comprising:

a well contact region of said second conductivity type selectively formed in a surface layer of each of said first well regions, being surrounded by said source region in a plan view, wherein said source contact hole reaches the depth deeper than 5 nm from said surface layer of said silicon carbide drift layer inside said well contact region.

11. A method of manufacturing a semiconductor device as defined in claim 9, comprising the step of:

forming said source contact hole by etching so that said source contact hole should reach the depth deeper than 5 nm from said surface layer of said silicon carbide drift layer inside said source region.

12. A semiconductor device, comprising:

a silicon carbide semiconductor substrate;

a silicon carbide drift layer of a first conductivity type formed on said silicon carbide semiconductor substrate;

first well regions each of a second conductivity type formed in a surface layer of a silicon carbide drift layer, being apart from one another, to form a plurality of unit cells;

a gate insulating film formed, extending on at least said silicon carbide drift layer and each of said first well regions;

a gate electrode selectively formed on said gate insulating film;

an interlayer insulating film which is formed to cover said gate insulating film and said gate electrode, a source contact hole penetrating through said gate insulating film and reaching the inside of said each of said first well regions; and a residual compressive stress layer formed on at least a side surface of said source contact hole, in which a compressive stress remains, and is also formed directly on an upper surface of said interlayer insulating film, wherein said residual compressive stress layer is formed on a bottom surface of said source contact hole, wherein:

said interlayer insulating film is so formed as to cover said gate insulating film and said gate electrode, said residual compressive stress layer is also formed on an upper surface of said interlayer insulating film, and said residual compressive stress layer is formed of a laminated layer film consisting of one layer containing Ti or more.

* * * * *